Oct. 10, 1950 R. P. WUERFEL 2,525,438

CIRCUIT TUNING UNIT

Filed April 1, 1946 2 Sheets-Sheet 1

INVENTOR.

ROBERT P. WUERFEL

BY Arthur M. Smith

ATTORNEY

Oct. 10, 1950 R. P. WUERFEL 2,525,438

CIRCUIT TUNING UNIT

Filed April 1, 1946 2 Sheets-Sheet 2

INVENTOR.
ROBERT P. WUERFEL
BY Arthur M. Smith
ATTORNEY

Patented Oct. 10, 1950

2,525,438

UNITED STATES PATENT OFFICE 2,525,438

CIRCUIT TUNING UNIT

Robert P. Wuerfel, Dexter, Mich.

Application April 1, 1946, Serial No. 658,626

7 Claims. (Cl. 250—36)

Figure 1:
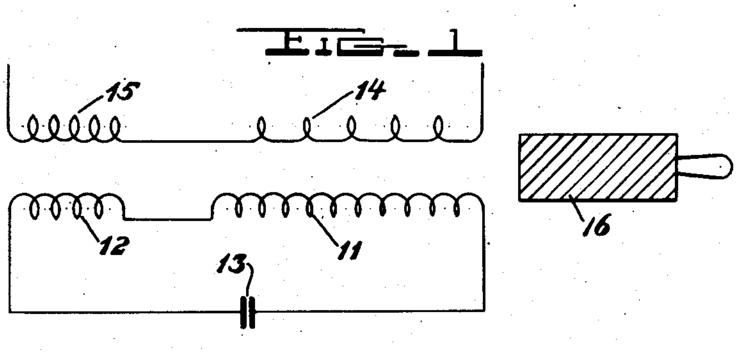

The present invention relates to a tuning unit for electrical circuits, and relates particularly to a unit for tuning a radio frequency oscillator circuit by means of a variable inductor.

In dealing with ultra high frequency electric currents, it is common practice to tune oscillator circuits by means of an adjustable core inductor comprising a solenoid in the oscillator circuit and a movable metal core plunger of suitable electrical conductivity and relatively low magnetic permeability. When the core plunger is brought within the field of the solenoid, a portion of the ultra high frequency current by-passes the solenoid through the core plunger with the result that the inductance of the solenoid is effectively reduced. Tuning is accomplished by adjusting the inductance of the solenoid to the desired value.

In ordinary high frequency or radio frequency oscillator circuits, the same convenient method of tuning has not been successful over an extended tuning range such as required in radio tuning. In practical application, as the core plunger is moved into the field of the solenoid, the ratio of the inductance of the circuit to be tuned to its resistance, or "Q," becomes so small that the circuit fails to oscillate.

Accordingly a primary object of the present invention is to provide a means for tuning radio frequency circuits and radio frequency oscillator circuits by means of a variable inductor.

Other objects of this invention will appear in the following description and appended claims, reference being had to the accompanying drawings forming a part of this specification wherein like reference characters designate corresponding parts in the several views.

Figure 2:
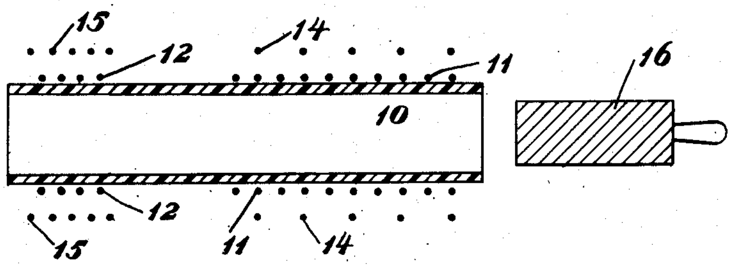
Figure 3:
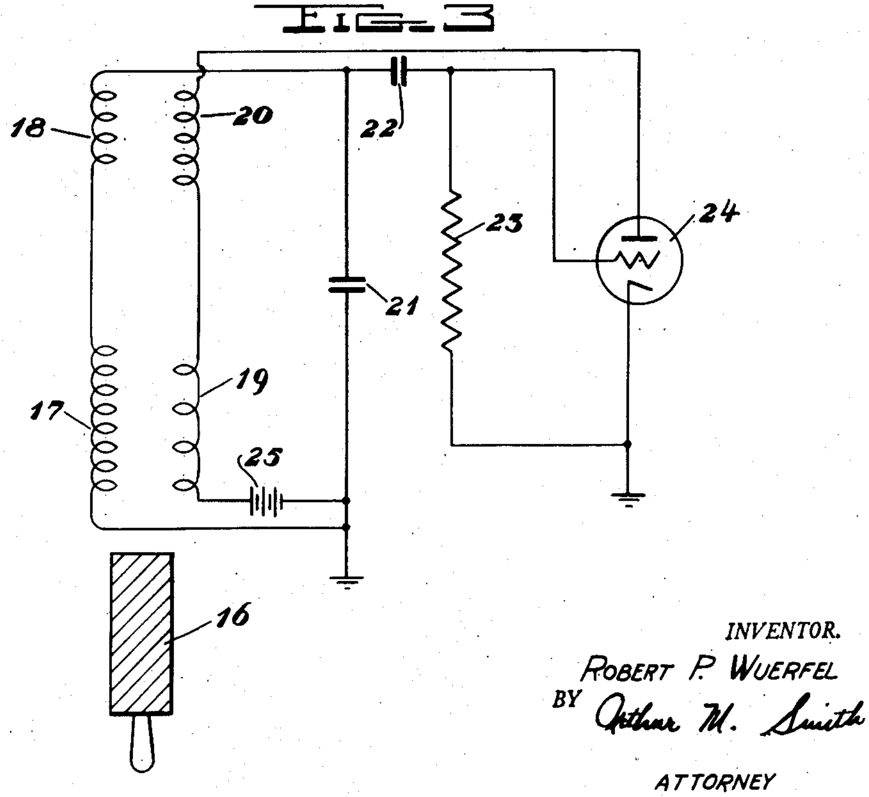
Figures 4, 5, 6:
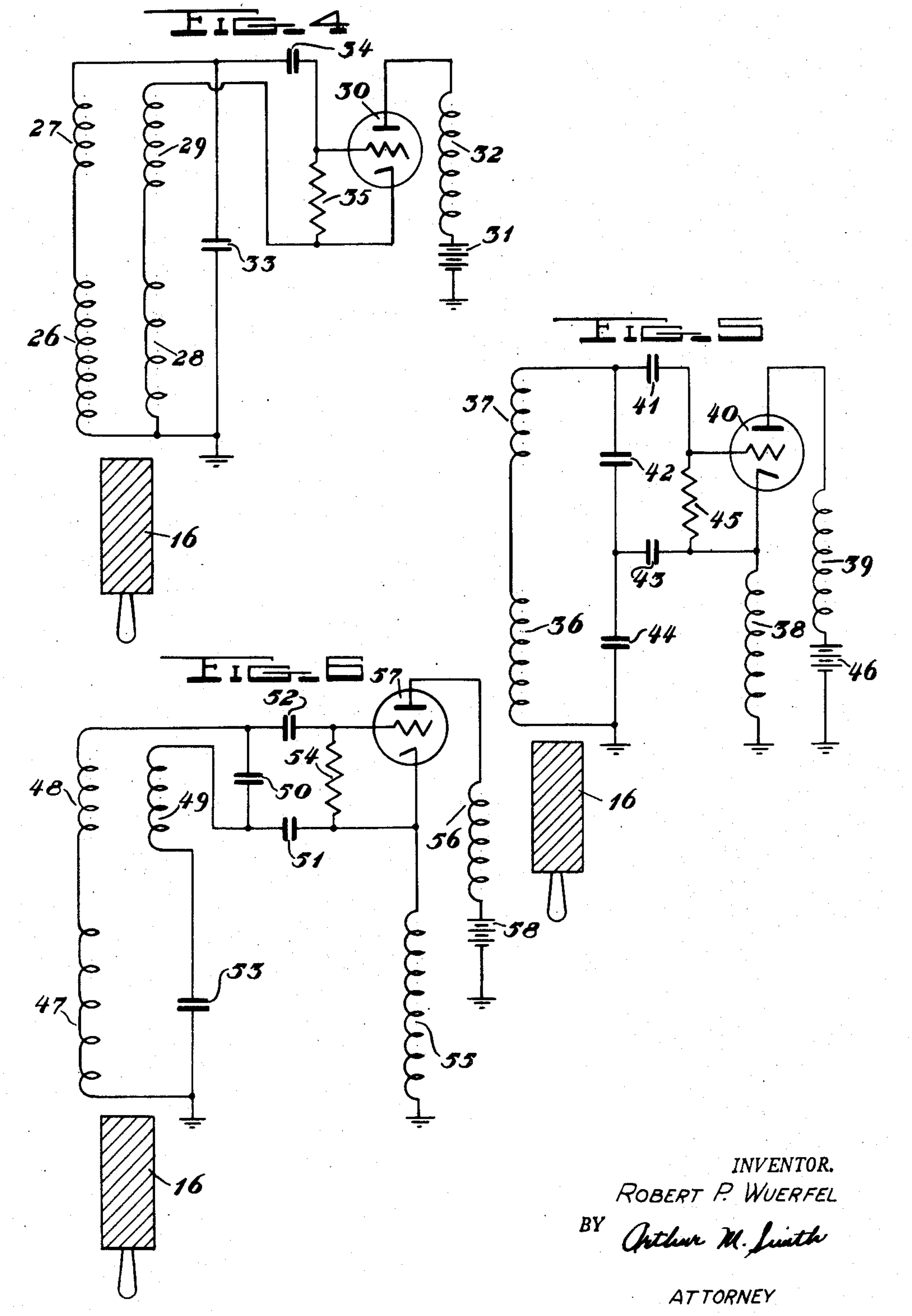

Fig. 1 is a schematic plan of the elementary electric circuits embodying the present invention, Fig. 2 is a schematic section view through a tuning solenoid embodying the present invention, Fig. 3 schematically shows an adaptation of the present invention to the principle of the Hartley oscillator circuit, Fig. 4 schematically shows an adaptation of the present invention to a modified Hartley oscillator circuit, Fig. 5 schematically shows an adaptation of the present invention to the principle of the Colpitts oscillator circuit, Fig. 6 schematically shows an adaptation of the present invention to a combination of the Hartley and Colpitts oscillator circuits.

Before explaining the present invention in detail it is to be understood that the invention is not limited in its application to the details of construction and arrangement of parts illustrated in the accompanying drawings, since the invention is capable of other embodiments and of being practiced or carried out in various ways. Also it is to be understood that the phraseology or terminology employed herein is for the purpose of description and not of limitation.

Referring to the drawings, an elementary oscillator circuit comprising the coils 11 and 12 and the condenser 13 is shown in schematic relationship to the tickler or feed back coils 14 and 15 and the core plunger 16. The feed back coils 14 and 15 can be an adaptation of any one of a number of well known feed back inductance couplings whereby power from the tuned oscillator circuit is amplified and fed back in the same phase and frequency to said oscillator circuit.

Fig. 2 is a schematic section view through the coil form 10, of Bakelite or suitable dielectric material, provided for the coils of Fig. 1. The plunger 16 is an electrical conductor of low magnetic permeability or a non-magnetic electrical conductor which will provide an effective short circuited turn for radio frequency currents in the coils 11 and 14 and reduce the inductances thereof when brought within the electromagnetic fields thereof. Plunger 16 may be grounded or not according to specific requirements. Copper, aluminum, and steel are examples of satisfactory materials for plunger 16.

The drawing indicates that plunger 16 is inserted within the coil form 10. This is not a limitation of the application of the invention. Plunger 16 may be used with equal success if it is adapted by tubular construction to move concentrically over the coil form 10 and the coils wound thereon. Likewise the shape of plunger 16 and coil form 10 is not controlling and may be square, oval, or of other convenient form.

Coils 11 and 12 are in series and may be one coil with the portion 12 merely wound on an extension of the coil form 10 beyond the limit of the leftward movement of the plunger 16, or if desired, coil 12 may be located away from coil 11 at an entirely different location. It is only essential that the portion of the windings which comprise coil 12 are sufficiently removed from the proximity of the limit of travel of plunger 16 so as not to be materially affected by said plunger 16 in its normal operating positions.

The same in general that is said about the location of coils 11 and 12 may also be said about coils 14 and 15. Coil 14 is wound around coil 11 or sufficiently adjacent thereto so that the fields of the two coils 11 and 14 mutually interact. Coil 15 is wound around coil 12 or located sufficiently adjacent thereto so that the fields of the two coils 12 and 15 also mutually interact and so that coil 15 is also not materially affected by the position of the plunger 16.

In operation, the circuit is tuned to a desired frequency by moving plunger 16 into the field of the coils 11 and 14. As plunger 16 approaches and enters the coil form 10, the high frequency currents of coils 11 and 14 are short circuited through plunger 16 with the result that the inductance of the circuit is effectively reduced. The farther plunger 16 enters the coil form 10, the more the inductance of the circuit is reduced.

Previous attempts to utilize the simple method of tuning which I have outlined have not been successful because of failure to realize the importance of the coils 12 and 15. When a simple inductive coupling between coils 11 and 14 is used alone, movement of plunger 16 into the coil form 10 causes the ratio of inductance to resistance, "Q," within the circuit to fall off so rapidly that tuning of the circuit becomes impossible, and in the case of oscillator circuits, the circuit fails to oscillate. Consequently this type of inductance circuit tuning for radio frequency circuits has not been previously used.

I have found that by proper selection of the feed back circuit in relation to coils 11 and 12, the difficulty of failure of oscillation can be completely overcome and uniform oscillator strength can be maintained over the entire tuning range. If desired, an increase in oscillator strength can even be achieved as the plunger moves from the low frequency end of the tuning range (plunger 16 withdrawn from coil form 10) to the high frequency end of the tuning range (plunger 16 within coil form 10 to the limit of its permissible movement).

Fig. 2 shows the essence of my invention wherein coil 14 is wound relatively sparsely around the coil form 10, and coil 15 is wound relatively compactly around an extension of coil form 10 removed from the limit of inward movement of plunger 16. Thus the number of turns of coil 15 comprises a substantial proportion of the total number of turns of both coils 14 and 15. The coils 11 and 12 are essentially uniformly and relatively closely wound. The particular spacing and number of the turns of the various coils shown is determined by the particular tuning requirements of the circuit involved. Also it is to be understood that the physical separation of the coils, as shown in the drawings, is greatly exaggerated for the purpose of illustration. Actually, with a coil form 10 of relatively small diameter, coils 11 and 12 may be essentially one coil with coil 12 merely extending a fraction of an inch beyond the extreme leftward limit of movement of plunger 16. The same follows for the arrangement of coils 14 and 15.

The arrangement shown in Figs. 1 and 2 favors power feed back to the oscillator circuit at the high frequency end of the tuning range and as plunger 16 approaches the limit of its leftward movement within the coil form 10. The above follows from the fact that the power transfer between an inductance coupling increases as the frequency of the alternating current increases, provided the strength of the current remains constant. Consequently as the frequency of the oscillator circuit increases and plunger 16 moves into the coil form 10, the portion of the power fed back to the oscillator circuit solely as a result of the inductance coupling between coils 12 and 15 is also increased.

By proper selection of the number and spacing of the windings of the coils involved the power feed back to the oscillator circuit maintains essentially constant oscillator strength over the entire turning range. The actual number of turns to be utilized in each of the coils 11, 12, 14 and 15 is readily ascertained from well known factors which determine the tuning range of oscillator circuits of the type shown in the figures, such as the length and diameter of the plunger 16, its proximity to the field of the coil to be tuned, the material of which it is made, and the length, diameter, and number of turns of the coils of the oscillator and feed back circuits.

The various physical characteristics and mechanical dimensions to produce a tuning range in excess of that which is ultimately desired are first selected, then that portion of the inductance of the oscillator circuit which is not required for the tuning range desired is utilized for the coils 12 and 15 and is removed from any appreciable effect of movement of the core plunger 16. This is an important feature of my invention.

Fig. 3 schematically shows my invention as adapted to the principle of the conventional Hartley oscillator circuit comprising the oscillator coils 17 and 18, the tickler or feed back coils 19 and 20, the condensers 21 and 22, the grid leak resistor 23, the triode 24 and the battery 25 for the plate potential of said triode 24, all connected as shown. The coils 17 and 18 correspond in function and arrangement to the coils 11 and 12 respectively of Figs. 1 and 2. Similarly the coils 19 and 20 correspond to the feed back coils 14 and 15 respectively of Figs. 1 and 2. The operation and function of the plunger 16 in respect to the coils of Fig. 3 is the same as described in detail in respect to Figs. 1 and 2.

Fig. 4 schematically shows my invention adapted to a conventional form of a modified Hartley oscillator circuit comprising the oscillator coils 26 and 27, the tickler coils 28 and 29 connected between the cathode of the triode 30 and ground, the battery 31 for the plate potential of said triode 30, the condensers 33 and 34, and the grid leak resistor 35, all connected as shown. Again the operation and function of plunger 16 and the coils 26, 27, 28 and 29 are similar to the operation and function of the plunger 16 and coils 11, 12, 14 and 15, respectively of Figs. 1 and 2.

It will be noted that my invention is not limited to an inductive coupling for the power feed back to the oscillator circuit. Fig. 5 schematically shows my invention as applied to the principle of capacitance power feed back of a conventional Colpitts oscillator circuit comprising the oscillator coils 36 and 37, the choke coil 38 which is not inductively coupled to coils 36 and 37, the triode 40, the condensers 41, 42, 43 and 44, the grid leak resistor 45 and the battery 46 for the plate potential, all connected as shown.

In this application power feed back and accordingly oscillator strength varies as a function of the inductive impedance of the coil 38 and as a function of the impedance of condenser 44. Thus at the high frequency end of the tuning range two factors must be considered and balanced. Failure of oscillation is avoided at all times by the coil 37 which is sufficiently removed from the limit of inward movement of plunger 16 so as not to be materially affected thereby. It then becomes merely a matter of engineering technique to select the proper values of the circuit elements involved to achieve constant oscillator strength over the entire tuning range desired, or even to increase the oscillator strength at the high frequency end of the tuning range to satisfy specific requirements.

Fig. 6 schematically shows my invention adapted to an oscillator circuit combining certain features of both the Colpitts and Hartley circuits and comprising the oscillator coils 47 and 48, the condensers 50, 51, 52, and 53, the grid leak resistor 54, the choke coil 55 which is not inductively coupled to the oscillator coils, the triode 57, and the battery 58 for the plate potential, all connected as shown. In this arrangement inductive coupling between the coils 48 and 49 favors power feed back at the high frequency end of the tuning range essentially as described in connection with Figs. 1 and 2. Also, similarly in action to the capacitance feed back described in relation to the Colpitts circuit of Fig. 5, at higher frequencies the decreased impedance across condenser 50 tends to decrease feed back of power through coil 47. At the same time, the effect of introducing plunger 16 into the field of coil 47 reduces the inductance of coil 47 and correspondingly tends to increase the power feed back through said coil 47. Again by proper selection of the values of the circuit elements involved, uniform oscillator strength can be maintained over the entire tuning range. Of course in this circuit, coils 48 and 49 are sufficiently removed from the limit of the inward travel of plunger 16 so as not to be effected thereby. The coils 32, 39 and 56 are not essentially parts of the oscillator circuits shown in Figs. 4, 5 and 6 respectively. The tube elements shown in Figs. 4, 5 and 6 would in usual practice be part of multi-purpose tubes with the plate circuit being tuned to the intermediate frequency as used in a superheterodyne circuit.

The adaptation of my invention to the specific conventional circuits above is by way of example and not of limitation. From the above description and disclosures it is seen that my invention in its broad aspects provides a new method of inductance tuning for radio frequency circuits and is not limited to a particular type of circuit arrangement.

I claim:

1. In an oscillator tuning system suitable for an electrical radio frequency oscillator circuit, the combination of a tuning inductance shunted with a condenser, a tickler coil inductively coupled to said tuning inductance to provide the power feed back for oscillation, a means for varying the inductance of the tuning inductance and including a movable core of electrical conducting material movable within the field of said tuning inductance, means to maintain oscillation of said oscillator circuit as said movable core moves into the field of said tuning inductance and including a portion of the total inductance of the tuning inductance and tickler coil removed from the position of maximum travel of said core into the field of said tuning inductance.

2. The combination as claimed in claim 1 and being further characterized in that said movable core is of non-magnetic material.

3. The combination as claimed in claim 2 and being further characterized in that a substantial portion of the total inductance of the tuning inductance and tickler coil is removed from the position of maximum travel of the movable core into the field of said tuning inductance.

4. In an oscillator tuning system suitable for an electrical radio frequency oscillation circuit, the combination of a tuning coil shunted with a fixed condenser, a tickler coil to provide power feed back for oscillation and wound concentrically with the tuning coil, means for varying the inductance of both of said coils simultaneously and including a movable core of electrical conducting material movable within the field of said coils, the turns of the said coils being so spaced that the resultant power feed back from the tickler coil maintains substantially uniform oscillation strength over the tuning range upon movement of said core.

5. The combination as claimed in claim 4 and being further characterized in that a portion of the inductance of each of said coils is sufficiently removed from the proximity of maximum travel of the core into the field of said coils so as to limit the damping effect of said core.

6. In an oscillator tuning system suitable for an electrical radio frequency oscillation circuit, the combination of a tuning coil shunted with a fixed condenser, a tickler coil to provide power feed back for oscillation and wound concentrically with the tuning coil, means for varying the inductance of both of said coils simultaneously and including a movable core of electrical conducting material movable within the field of said coils, the turns of the said coils being inductively coupled to maintain substantially uniform oscillation strength over the tuning range upon movement of said core.

7. The combination as claimed in claim 6 and being further characterized in that a portion of the inductance of each of said coils is sufficiently removed from the proximity of maximum travel of the core into the field of said coils so as to limit the damping effect of said core.

ROBERT P. WUERFEL.

REFERENCES CITED

The following references are of record in the file of this patent:

UNITED STATES PATENTS

| Number | Name | Date |
|---|---|---|
| 1,606,792 | Isles | Nov. 16, 1926 |
| 1,792,144 | Cohen et al. | Feb. 10, 1931 |
| 2,055,375 | Cohen | Sept. 22, 1936 |
| 2,255,680 | Sands et al. | Sept. 9, 1941 |
| 2,276,699 | Preisig | Mar. 17, 1942 |
| 2,289,670 | McClellan | July 14, 1942 |
| 2,322,722 | Wentworth | June 22, 1943 |